United States Patent
Rocha-Alvarez et al.

(10) Patent No.: US 6,797,643 B2
(45) Date of Patent: Sep. 28, 2004

(54) PLASMA ENHANCED CVD LOW K CARBON-DOPED SILICON OXIDE FILM DEPOSITION USING VHF-RF POWER

(75) Inventors: Juan Carlos Rocha-Alvarez, Sunnyvale, CA (US); Maosheng Zhao, Santa Clara, CA (US); Ying Yu, Cupertino, CA (US); Shankar Venkataraman, Santa Clara, CA (US); Srinivas D. Nemani, Sunnyvale, CA (US); Li-Qun Xia, Santa Clara, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/279,367

(22) Filed: Oct. 23, 2002

(65) Prior Publication Data

US 2004/0082193 A1 Apr. 29, 2004

(51) Int. Cl.[7] ............................................. H01L 21/31
(52) U.S. Cl. .................... 438/758; 438/622; 438/623; 438/767; 438/790; 438/633
(58) Field of Search ......................... 438/758, 623, 438/622, 767, 790, 633

(56) References Cited

U.S. PATENT DOCUMENTS

| | | | |
|---|---|---|---|
| 5,294,858 A | * 3/1994 | Nakahata et al. | 310/313 A |
| 5,463,978 A | * 11/1995 | Larkin et al. | 117/89 |
| 5,466,728 A | * 11/1995 | Babcock et al. | 523/179 |
| 5,556,501 A | 9/1996 | Collins et al. | 156/345 |
| 5,627,079 A | * 5/1997 | Gardella et al. | 436/525 |
| 5,656,123 A | 8/1997 | Salimian et al. | 156/345 |
| 5,707,486 A | 1/1998 | Collins et al. | 156/643.1 |
| 5,824,607 A | 10/1998 | Trow et al. | 438/732 |
| 5,886,067 A | * 3/1999 | Li et al. | 523/201 |
| 5,905,117 A | * 5/1999 | Yokotsuka et al. | 525/104 |
| 5,935,374 A | 8/1999 | Ito et al. | 156/345 |
| 6,054,379 A | 4/2000 | Yau et al. | 438/623 |
| 6,103,781 A | * 8/2000 | Li et al. | 523/201 |
| 6,142,096 A | 11/2000 | Sakai et al. | 118/723 |
| 6,238,751 B1 | 5/2001 | Mountsier | 427/574 |
| 6,287,943 B1 | 9/2001 | Fujioka et al. | 438/485 |
| 6,287,990 B1 | 9/2001 | Cheung et al. | 438/780 |
| 6,312,793 B1 | 11/2001 | Grill et al. | 428/312 |
| 6,340,628 B1 | 1/2002 | Van Cleemput et al. | 438/586 |
| 6,352,945 B1 | 3/2002 | Matsuki et al. | 438/778 |
| 6,383,955 B1 | 5/2002 | Matsuki et al. | 438/790 |
| 6,410,463 B1 | 6/2002 | Matsuki et al. | 438/790 |
| 6,525,144 B1 | * 2/2003 | Tanahashi et al. | 525/332.1 |
| 6,531,193 B2 | * 3/2003 | Fonash et al. | 427/579 |
| 6,596,627 B2 | * 7/2003 | Mandal | 438/622 |
| 2001/0021590 A1 | 9/2001 | Matsuki et al. | 438/780 |
| 2001/0051308 A1 | * 12/2001 | Kawamura et al. | 430/66 |
| 2002/0001924 A1 | 1/2002 | Fujioka et al. | 438/485 |
| 2002/0016085 A1 | 2/2002 | Huang et al. | 438/798 |
| 2002/0197849 A1 | * 12/2002 | Mandal | 438/633 |
| 2003/0008155 A1 | * 1/2003 | Hayashi et al. | 428/447 |
| 2003/0022468 A1 | 1/2003 | Shioya et al. | 438/485 |
| 2003/0022519 A1 | 1/2003 | Fujioka et al. | 438/758 |

FOREIGN PATENT DOCUMENTS

| | | | |
|---|---|---|---|
| EP | 0 520 519 | 12/1992 | H01J/37/32 |
| JP | 9 320 966 | 12/1997 | H01L/16/50 |

* cited by examiner

Primary Examiner—John F. Niebling
Assistant Examiner—Oliva T. Luk
(74) Attorney, Agent, or Firm—Moser, Patterson & Sheridan

(57) ABSTRACT

A method of depositing a low dielectric constant film on a substrate. In one embodiment, the method includes the steps of positioning the substrate in a deposition chamber, providing a gas mixture to the deposition chamber, in which the gas mixture is comprised of one or more cyclic organosilicon compounds, one or more aliphatic compounds and one or more oxidizing gases. The method further includes reacting the gas mixture in the presence of an electric field to form the low dielectric constant film on the semiconductor substrate. The electric field is generated using a very high frequency power having a frequency in a range of about 20 MHz to about 100 MHz.

24 Claims, 2 Drawing Sheets

PLASMA ENHANCED CVD LOW K CARBON-DOPED SILICON OXIDE FILM DEPOSITION USING VHF-RF POWER

CROSS-REFERENCE TO RELATED APPLICATIONS

This application is related to U.S. Ser. No. 10/115,832 (AMAT/5869) by Li et al. and entitled "HARDNESS IMPROVEMENT OF SILICON CARBOXY FILMS", U.S. Ser. No. 09/660,268 (AMAT/4525) by Nemani et al. and entitled "DUAL FREQUENCY PLASMA ENHANCED CHEMICAL VAPOR DEPOSITION OF SILICON CARBIDE LAYERS", U.S. Ser. No. 09/885,985 (AMAT/5977) by Cho et al. and entitled "CVD PLASMA ASSISTED LOWER DIELECTRIC CONSTANT SICOH FILM", and U.S. Ser. No. 10/121,284 (AMAT/6147) by Li et al. and entitled "CROSSLINK CYCLO-SILOXANE COMPOUND WITH LINEAR BRIDGING GROUP TO FORM ULTRA LOW K DIELECTRIC", which are all incorporated herein by reference.

BACKGROUND OF THE INVENTION

1. Field of the Invention

Embodiments of the present invention generally relate to the fabrication of integrated circuits, and more particularly, to a process for depositing dielectric layers on a substrate.

2. Description of the Related Art

Integrated circuit geometries have dramatically decreased in size since such devices were first introduced several decades ago. Since then, integrated circuits have generally followed the two year/half-size rule (often called Moore's Law), which means that the number of devices on a chip doubles every two years. Today's fabrication facilities are routinely producing devices having 0.13 micrometer and even 0.1 micrometer feature sizes, and tomorrow's facilities soon will be producing devices having even smaller feature sizes.

The continued reduction in device geometries has generated a demand for films having lower k values because the capacitive coupling between adjacent metal lines must be reduced to further reduce the size of devices on integrated circuits. In particular, insulators having low dielectric constants (k), less than about 4.0, are desirable. Examples of insulators having low dielectric constants include carbon doped silicon oxide (SiCOH), fluorine-doped silicon glass (FSG) and polytetrafluoroethylene (PTFE).

Rose et al. (U.S. Pat. No. 6,068,884) proposed a method for depositing an insulator by partially fragmenting a cyclic organosilicon compound to form both cyclic and linear structures in the deposited film. However, partially fragmenting cyclic precursors is difficult to control and thus, product consistency is difficult to achieve.

Therefore, a need exists for an improved method for depositing films with lower dielectric values.

SUMMARY OF THE INVENTION

Embodiments of the present invention are generally directed to a method of depositing a low dielectric constant film on a substrate. In one embodiment, the method includes the steps of positioning the substrate in a deposition chamber, providing a gas mixture to the deposition chamber, in which the gas mixture is comprised of one or more cyclic organosilicon compounds, one or more aliphatic compounds and one or more oxidizing gases. The method further includes reacting the gas mixture in the presence of an electric field to form the low dielectric constant film on the semiconductor substrate. The electric field is generated using a very high frequency power having a frequency in a range of about 20 MHz to about 100 MHz.

In another embodiment, the present invention is directed to a method of depositing a low dielectric constant film on a substrate, which includes positioning the substrate in a deposition chamber and providing a gas mixture to the deposition chamber. The gas mixture includes one or more cyclic organosilicon compounds, one or more aliphatic compounds, one or more meta-stable organic compounds and one or more oxidizing gases. The method further includes reacting the gas mixture in the presence of an electric field to transform the meta-stable organic compound to an unstable component within a network of the film. The electric field is generated using a very high frequency power having a frequency in a range of about 20 MHz to about 100 MHz. The method also includes annealing the film to remove the unstable component from the film.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
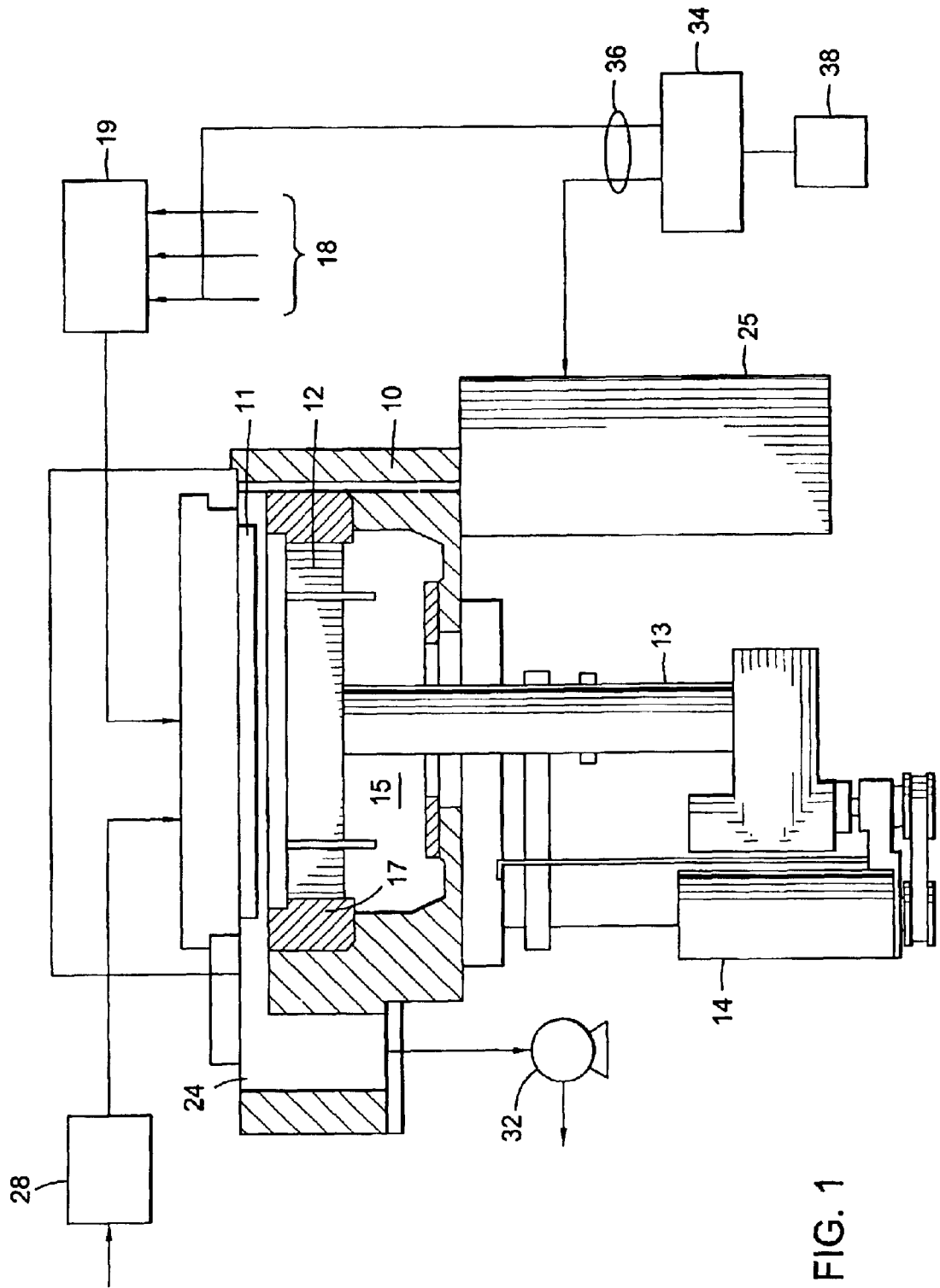
FIG. 1 is a cross-sectional diagram of an exemplary CVD reactor configured for use according to embodiments described herein.

Various embodiments of the present invention provide a significant and unexpected reduction in dielectric constants for films containing silicon, oxygen, and carbon by blending one or more cyclic organosilicon compounds and one or more aliphatic compounds with an oxidizing gas at very high frequency RF plasma conditions sufficient to form a low dielectric constant film. The low dielectric constant film has a dielectric constant of about 3.0 or less, preferably about 2.5 or less. In one embodiment, the low dielectric constant film is a SiCOH film.

The cyclic organosilicon compounds include a ring structure having three or more silicon atoms, and the ring structure may further comprise one or more oxygen atoms. Commercially available cyclic organosilicon compounds include rings having alternating silicon and oxygen atoms with one or two alkyl groups bonded to the silicon atoms. For example, the cyclic organosilicon compounds may include one or more of the following compounds:

1,3,5-trisilano-2,4,6-trimethylene, ($—SiH_2—CH_2—)_3—$ (cyclic)

1,3,5,7-tetramethylcyclotetrasiloxane (TMCTS), ($—SiH(CH_3)—O—)_4—$(cyclic)

octamethylcyclotetrasiloxane (OMCTS), ($—Si(CH_3)_2—O—)_4—$(cyclic)

1,3,5,7,9-pentamethylcyclopentasiloxane, ($—SiH(CH_3)—O—)_5—$(cyclic)

1,3,5,7-tetrasilano-2,6-dioxy-4,8-dimethylene,
(—$SiH_2$—$CH_2$—$SiH_2$—O—)$_2$—(cyclic)
hexamethylcyclotrisiloxane (—$Si(CH_3)_2$—O—)$_3$—
(cyclic)

The aliphatic compounds include linear or branched (i.e. acyclic) organosilicon compounds having one or more silicon atoms and one or more carbon atoms and linear or branched hydrocarbon compounds having at least one unsaturated carbon bond. The structures may further comprise oxygen. Commercially available aliphatic organosilicon compounds include organosilanes that do not contain oxygen between silicon atoms and organosiloxanes that contain oxygen between two or more silicon atoms. For example, the aliphatic organosilicon compounds may include one or more of the following compounds:

| | |
|---|---|
| methylsilane | $CH_3$—$SiH_3$ |
| dimethylsilane | $(CH_3)_2$—$SiH_2$ |
| trimethylsilane | $(CH_3)_3$—SiH |
| dimethyl-dimethoxysilane | $(CH_3)_2$—Si—(O—$CH_3)_2$ |
| ethylsilane | $CH_3$—$CH_2$—$SiH_3$ |
| disilanomethane | $SiH_3$—$CH_2$—$SiH_3$ |
| bis(methylsilano)-methane | $CH_3$—$SiH_2$—$CH_2$—$SiH_2$—$CH_3$ |
| 1,2-disilanoethane | $SiH_3$—$CH_2$—$CH_2$—$SiH_3$ |
| 1,2-bis(methylsilano)-ethane | $CH_3$—$SiH_2$—$CH_2$—$CH_2$—$SiH_2$—$CH_3$ |
| 2,2-disilanopropane | $SiH_3$—$C(CH_3)_2$—$SiH_3$ |
| 1,3-dimethyldisiloxane | $CH_3$—$SiH_2$—O—$SiH_2$—CH |
| 1,1,3,3-tetra-methyldisiloxane (TMDSO) | $(CH_3)_2$—SiH—O—SiH—$(CH_3)_2$ |
| hexamethyl-disiloxane (HMDS) | $(CH_3)_3$—Si—O—Si—$(CH_3)_3$ |
| 1,3-bis-(silanomethylene)-disiloxane | $(SiH_3$—$CH_2$—$SiH_2$—$)_2$—O |
| bis-(1-methyldisiloxanyl)-methane | $(CH_3$—$SiH_2$—O—$SiH_2$—$)_2$—$CH_2$ |
| 2,2-bis-(1-methyldisiloxanyl)-propane | $(CH_3$—$SiH_2$—O—$SiH_2$—$)_2$—$C(CH_3)_2$ |
| hexamethoxy-disiloxane (HMDOS) | $(CH_3$—$O)_3$—Si—O—Si—(O—$CH_3)_3$ |
| diethylsilane | $(C_2H_5)_2SiH_2$ |
| propylsilane | $C_3H_7SiH_3$ |
| vinylmethylsilane | $CH_2$=CH—$SiH_2$—$CH_3$ |
| 1,1,2,2-tetramethyl-disilane | $(CH_3)$—S:G—S:H—$(CH_3)_2$ |
| hexamethyldisilane | $(CH_3)_3$—Si—Si—$(CH_3)_3$ |
| 1,1,2,2,3,3-hexa-methyltrisilane | $(CH_3)_2$—SiH—$Si(CH_3)_2$—SiH—$(CH_3)_2$ |
| 1,1,2,3,3-penta-methyltrisilane | $(CH_3)_2SiH$—$SiH(CH_3)$—$SiH(CH_3)_2$ |
| dimethyldisilanoethane | $CH_3$—$SiH_2$—$(CH_2)_2$—$SiH_2$—$CH_3$ |
| dimethyldisilano-propane | $CH_3$—SiH—$(CH_2)_3$—SiH—$CH_3$ |
| tetramethyldisilano-ethane | $(CH_3)_2$—SiH—$(CH_2)_2$—SiH—$(CH_3)_2$ |
| tetramethyldisilano-propane | $(CH_3)_2$—SiH—$(CH_2)_3$—Si—$(CH_3)_2$ |

The aliphatic compounds may also include aliphatic hydrocarbon compounds having between one and about twenty adjacent carbon atoms. The hydrocarbon compounds have between one and about twenty adjacent carbon atoms. The hydrocarbon compounds can include adjacent carbon atoms that are bonded by any combination of single, double, and triple bonds. For example, the organic compounds may include alkenes and alkylenes having two to about twenty carbon atoms, such as ethylene, propylene, acetylene, and butadiene.

The one or more oxidizing gases may include oxygen ($O_2$), ozone ($O_3$), nitrous oxide ($N_2O$), carbon monoxide (CO), carbon dioxide ($CO_2$), water ($H_2O$), peroxide ($H_2O_2$) or combinations thereof. In one aspect, the oxidizing gas is oxygen gas. In another aspect, the oxidizing gas is ozone. When ozone is used as an oxidizing gas, an ozone generator converts from 6% to 20%, typically about 15%, by weight of the oxygen in a source gas to ozone, with the remainder typically being oxygen. Yet, the ozone concentration may be increased or decreased based upon the amount of ozone desired and the type of ozone generating equipment used. The one or more oxidizing gases are added to the reactive gas mixture to increase reactivity and achieve the desired carbon content in the deposited film.

The deposited film contains a carbon content between about 5 and about 30 atomic percent (excluding hydrogen atoms), preferably between about 5 and about 20 atomic percent. The carbon content of the deposited films refers to atomic analysis of the film structure that typically does not contain significant amounts of non-bonded hydrocarbons. The carbon contents are represented by the percent of carbon atoms in the deposited film, excluding hydrogen atoms that are difficult to quantify. For example, a film having an average of one silicon atom, one oxygen atom, one carbon atom, and two hydrogen atoms has a carbon content of 20 atomic percent (one carbon atom per five total atoms), or a carbon content of 33 atomic percent, excluding hydrogen atoms (one carbon atom per three total atoms, other than hydrogen atoms).

One or more meta-stable compounds may be added to the mixture described above to further reduce the dielectric constant of the deposited film. The meta-stable compound first forms an unstable component within the film network and then is removed from the film network using an anneal treatment. The removal of the unstable component during the anneal treatment forms a void within the network leaving behind a film having a significantly lower dielectric constant. The meta-stable compound is also known as a "leaving group" because of the nature of the process whereby the meta-stable compound leaves the network to form one or more voids therein. Exemplary meta-stable compounds may include t-butylethylene, 1,1,3,3-tetramethylbutylbenzene, t-butylether, metyl-methacrylate (MMA), and t-butylfurfurylether.

The film may be deposited using any processing chamber capable of chemical vapor deposition (CVD). For example, FIG. 1 shows a vertical, cross-section view of a parallel plate CVD processing chamber 10. The chamber 10 includes a high vacuum region 15 and a gas distribution manifold 11 having perforated holes for dispersing process gases therethrough to a substrate (not shown). The substrate rests on a substrate support plate or susceptor 12. The susceptor 12 is mounted on a support stem 13 that connects the susceptor 12 to a lift motor 14. The lift motor 14 raises and lowers the susceptor 12 between a processing position and a lower, substrate-loading position so that the susceptor 12 (and the substrate supported on the upper surface of susceptor 12) can be controllably moved between a lower loading/off-loading position and an upper processing position which is closely adjacent to the manifold 11. An insulator 17 surrounds the susceptor 12 and the substrate when in an upper processing position.

Gases introduced to the manifold 11 are uniformly distributed radially across the surface of the substrate. A vacuum pump 32 having a throttle valve controls the exhaust rate of gases from the chamber 10 through a manifold 24. Deposition and carrier gases, if needed, flow through gas lines 18 into a mixing system 19 and then to the manifold 11. Generally, each process gas supply line 18 includes (i) safety shut-off valves (not shown) that can be used to automatically or manually shut off the flow of process gas into the chamber, and (ii) mass flow controllers (also not shown) to measure the flow of gas through the gas supply lines 18. When toxic gases are used in the process, several safety shut-off valves are positioned on each gas supply line 18 in conventional configurations.

During deposition, a blend/mixture of one or more cyclic organosilicon compounds and one or more aliphatic compounds are reacted with an oxidizing gas to form an ultra low k film on the substrate. In one embodiment, the low k film is a SiCOH film. The cyclic organosilicon compounds may be combined with at least one aliphatic organosilicon compound and at least one aliphatic hydrocarbon compound. For example, the mixture contains about 5 percent by volume to about 80 percent by volume of the one or more cyclic organosilicon compounds, about 5 percent by volume to about 15 percent by volume of the one or more aliphatic organosilicon compounds, and about 5 percent by volume to about 45 percent by volume of the one or more aliphatic hydrocarbon compounds. The mixture also contains about 5 percent by volume to about 20 percent by volume of the one or more oxidizing gases. Alternatively, the mixture may contain about 45 percent by volume to about 60 percent by volume of one or more cyclic organosilicon compounds, about 5 percent by volume to about 10 percent by volume of one or more aliphatic organosilicon compounds, and about 5 percent by volume to about 35 percent by volume of one or more aliphatic hydrocarbon compounds.

In one aspect, the one or more cyclic organosilicon compounds are introduced to the mixing system 19 at a flowrate of about 100 to about 10,000 sccm, preferably about 520 sccm. The one or more aliphatic organosilicon compounds are introduced to the mixing system 19 at a flowrate of about 100 to about 1,000 sccm, preferably about 600 sccm. The one or more aliphatic hydrocarbon compounds are introduced to the mixing system 19 at a flowrate of about 100 to about 10,000 sccm, preferably 2,000 sccm. The oxygen containing gas has a flowrate between about 100 and about 6,000 sccm, preferably 1,000 sccm. Preferably, the cyclic organosilicon compound is 1,3,5,7-tetramethylcyclotetrasiloxane, octamethylcyclotetrasiloxane, or a mixture thereof, and the aliphatic organosilicon compound is trimethylsilane, 1,1,3,3-tetramethyldisiloxane, or a mixture thereof. The aliphatic hydrocarbon compound is preferably ethylene.

In another aspect, the blend/mixture further includes one or more meta-stable precursors. The one or more meta-stable precursors are added in amounts of about 100 sccm to about 5,000 sccm. Preferably, the meta-stable organic precursor is t-butylether.

In accordance with an embodiment of the invention, a controlled plasma is formed adjacent the substrate by a high frequency energy, such as VHF-RF energy, applied to the gas distribution manifold 11 using a high frequency power supply 25. In another embodiment, the high frequency power may be provided to the susceptor 12. In yet another embodiment, the high frequency power may be provided to both the gas distribution manifold 11 and the susceptor 12. The high frequency power may be used to promote greater porosity in the deposited film. By using a high frequency energy, such as VHF-RF, the plasma sheath voltage at the substrate is reduced, thereby reducing the ion acceleration energy at the substrate. Using the high frequency energy as the excitation energy may also increase the residence time of the gas molecules inside the chamber, thereby enhancing the vapor phase reaction. Furthermore, using the high frequency energy may permit increasing the plasma density at the substrate, thereby increasing the film deposition rate.

The high frequency power supply 25 is configured to supply a single high frequency power between approximately 20 MHz and 100 MHz, preferably between approximately 27 MHz and 100 MHz. In one embodiment, the frequency for the high frequency power supply 25 is 68 MHz. Alternatively, the high frequency power may be delivered using mixed, simultaneous frequencies to enhance the decomposition of reactive species introduced into the high vacuum region 15. For example, the mixed frequency may include a lower frequency in the range of between approximately 400 KHz and 14 MHz and a higher frequency in the range of between approximately 20 MHz and 100 MHz.

During deposition, the substrate is maintained at a temperature between about −20° C. and about 500° C., preferably between about 100° C. and about 400° C. The deposition pressure is typically between about 0.5 Torr and about 20 Torr, preferably between about 2 Torr and about 8 Torr. The deposition rate is typically between about 5,000 A/min and about 20,000 A/min.

When additional dissociation of the oxidizing gas is desired, an optional microwave chamber 28 can be used to input power from between about 50 Watts and about 6,000 Watts to the oxidizing gas prior to the gas entering the processing chamber 10. The additional microwave power can avoid excessive dissociation of the organosilicon compounds prior to reaction with the oxidizing gas. A gas distribution plate (not shown) having separate passages for the organosilicon compound and the oxidizing gas is preferred when microwave power is added to the oxidizing gas.

Typically, any or all of the chamber lining, distribution manifold 11, susceptor 12, and various other reactor hardware is made out of materials such as aluminum, anodized aluminum or aluminum nitride. An example of such a CVD reactor is described in U.S. Pat. No. 5,000,113, entitled "A Thermal CVD/PECVD Reactor and Use for Thermal Chemical Vapor Deposition of Silicon Dioxide and In-situ Multi-step Planarized Process," which is incorporated by reference herein.

A system controller 34 controls the motor 14, the gas mixing system 19, and the high frequency power supply 25, which are connected therewith by control lines 36. The system controller 34 controls the activities of the CVD reactor and typically includes a hard disk drive, a floppy disk drive, and a card rack. The card rack contains a single board computer (SBC), analog and digital input/output boards, interface boards, and stepper motor controller boards. The system controller 34 conforms to the Versa Modular Europeans (VME) standard, which defines board, card cage, and connector dimensions and types. The VME standard also defines the bus structure having a 16-bit data bus and 24-bit address bus.

An anneal treatment removes any meta-stable component from the film network as well as reduces a moisture content of the film. Moisture content may arise due to exposure to ambient air or by-product formation, for example. Preferably, the film is subjected to a temperature between about 100° C. and about 400° C. for about 10 minutes to about 1 hour, preferably about 30 minutes. A non-reactive gas such as helium, hydrogen, nitrogen, or a mixture thereof is introduced at a rate of 100 to about 10,000 sccm. The chamber pressure is maintained between about 2 Torr and about 10 Torr. The power is generally about 200 W to about 1,000 W at a frequency of about 350 KHz to about 100 MHz, and the preferable substrate spacing is between about 300 mils and about 800 mils.

Figure 2:
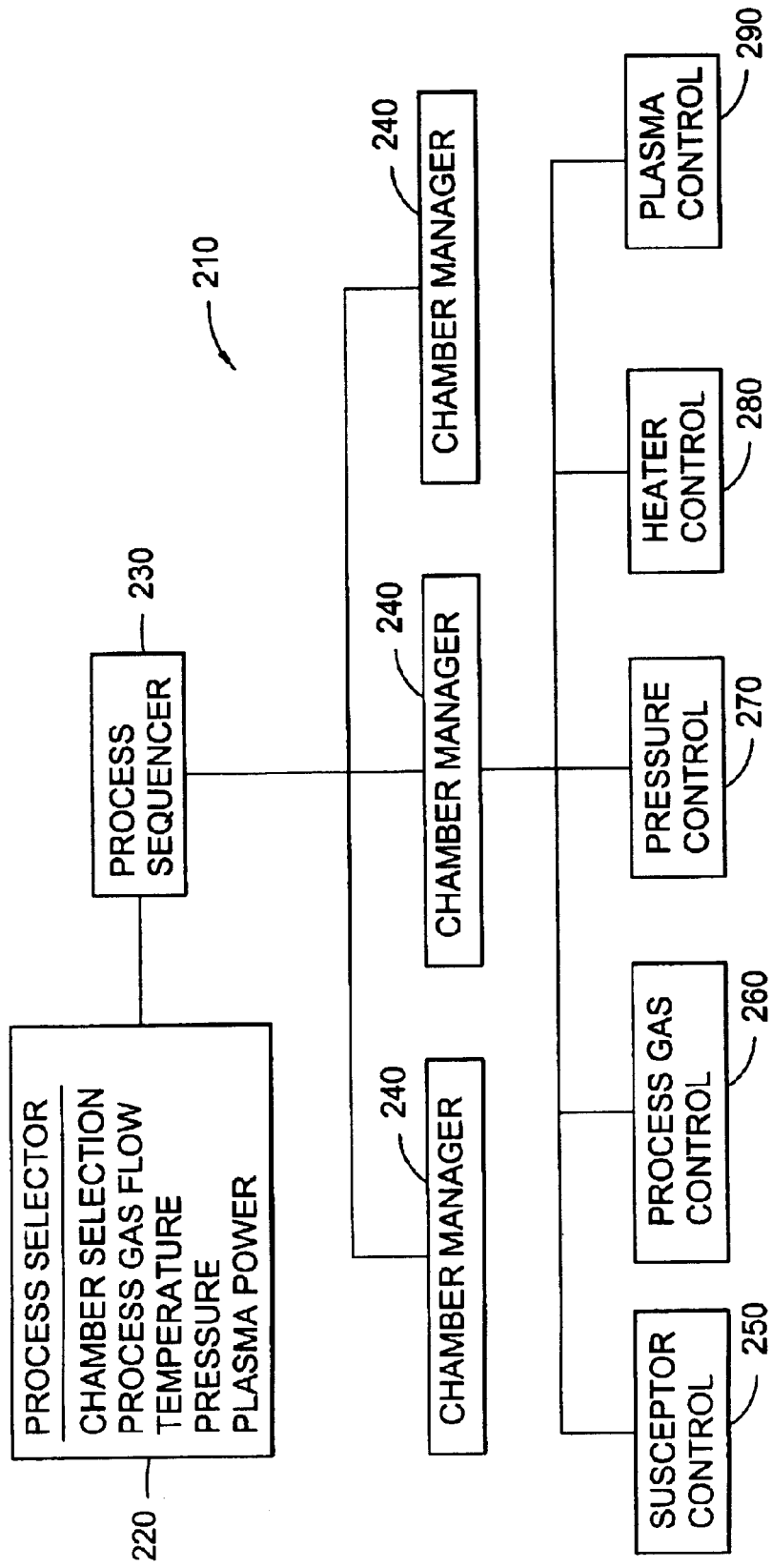
FIG. 2 is a flow chart of a process control computer program product used in conjunction with the exemplary CVD reactor of FIG. 1.

FIG. 2 shows an illustrative block diagram of a hierarchical control structure of a computer program 210. The system controller 34 operates under the control of the computer program 210 stored on a hard disk drive 38. The computer program 210 dictates the timing, mixture of gases, VHF-RF power levels, susceptor position, and other parameters of a particular process. The computer program code can be written in any conventional computer readable programming language such as, for example, 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

A user enters a process set number and process chamber number into a process selector subroutine 220 in response to menus or screens displayed on the CRT monitor by using the light pen interface. The process sets are predetermined sets of process parameters necessary to carry out specified processes, and are identified by predefined set numbers. The process selector subroutine 220 (i) selects a desired process chamber on the cluster tool, and (ii) selects a desired set of process parameters needed to operate the process chamber for performing the desired process. The process parameters for performing a specific process are provided to the user in the form of a recipe and relate to process conditions such as, for example, process gas composition, flow rates, temperature, pressure, plasma conditions such as VHF-RF bias power levels and magnetic field power levels, cooling gas pressure, and chamber wall temperature. The parameters specified by the recipe are entered utilizing the light pen/ CRT monitor interface. The signals for monitoring the process are provided by the analog input and digital input boards of the system controller 34 and the signals for controlling the process are output to the analog output and digital output boards of the system controller 34.

A process sequencer subroutine 230 has program code for accepting the identified process chamber and set of process parameters from the process selector subroutine 220, and for controlling operation of the various process chambers. Multiple users can enter process set numbers and process chamber numbers, or a user can enter multiple process chamber numbers, so the sequencer subroutine 230 operates to schedule the selected processes in the desired sequence. Preferably the sequencer subroutine 230 includes computer readable program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling a process execute, the sequencer subroutine 230 can be designed to take into consideration the present condition of the process chamber being used in comparison with the desired process conditions for a selected process, or the "age" of each particular user entered request, or any other relevant factor a system programmer desires to include for determining the scheduling priorities.

Once the sequencer subroutine 230 determines which process chamber and process set combination is going to be executed next, the sequencer subroutine 230 causes execution of the process set by passing the particular process set parameters to a chamber manager subroutine 240 which controls multiple processing tasks in a process chamber according to the process set determined by the sequencer subroutine 230. For example, the chamber manager subroutine 240 includes program code for controlling CVD process operations in the process chamber 10. The chamber manager subroutine 240 also controls execution of various chamber component subroutines that control operation of the chamber component necessary to carry out the selected process set. Examples of chamber component subroutines are susceptor control subroutine 250, process gas control subroutine 260, pressure control subroutine 270, heater control subroutine 280, and plasma control subroutine 290. Those having ordinary skill in the art would readily recognize that other chamber control subroutines can be included depending on what processes are desired to be performed in a processing chamber.

In operation, the chamber manager subroutine 240 selectively schedules or calls the process component subroutines in accordance with the particular process set being executed. The chamber manager subroutine 240 schedules the process component subroutines similarly to how the sequencer subroutine 230 schedules which process chamber and process set is to be executed next. Typically, the chamber manager subroutine 240 includes steps of monitoring the various chamber components, determining which components needs to be operated based on the process parameters for the process set to be executed, and causing execution of a chamber component subroutine responsive to the monitoring and determining steps.

Operation of particular chamber component subroutines will now be described with reference to FIG. 2. The susceptor control positioning subroutine 250 has program code for controlling chamber components that are used to load the substrate onto the susceptor 12, and optionally to lift the substrate to a desired height in the processing chamber 10 to control the spacing between the substrate and the gas distribution manifold 11. When a substrate is loaded into the processing chamber 10, the susceptor 12 is lowered to receive the substrate, and thereafter, the susceptor 12 is raised to the desired height in the chamber to maintain the substrate at a first distance or spacing from the gas distribution manifold 11 during the CVD process. In operation, the susceptor control subroutine 250 controls movement of the susceptor 12 in response to process set parameters that are transferred from the chamber manager subroutine 240.

The process gas control subroutine 260 has program code for controlling process gas compositions and flow rates. The process gas control subroutine 260 controls the open/close position of the safety shut-off valves, and also ramps up/down the mass flow controllers to obtain the desired gas flow rate. The process gas control subroutine 260 is invoked by the chamber manager subroutine 240, as are all chamber components subroutines, and receives from the chamber manager subroutine process parameters related to the desired gas flow rates. Typically, the process gas control subroutine 260 operates by opening the gas supply lines, and repeatedly (i) reading the necessary mass flow controllers, (ii) comparing the readings to the desired flow rates received from the chamber manager subroutine 240, and (iii) adjusting the flow rates of the gas supply lines as necessary. Furthermore, the process gas control subroutine 260 includes steps for monitoring the gas flow rates for unsafe rates, and activating the safety shut-off valves when an unsafe condition is detected.

In some processes, an inert gas such as helium or argon is put into the processing chamber 10 to stabilize the pressure in the chamber before reactive process gases are introduced. For these processes, the process gas control subroutine 260 is programmed to include steps for flowing the inert gas into the chamber 10 for an amount of time necessary to stabilize the pressure in the chamber, and then the steps described above would be carried out.

Additionally, when a process gas is to be vaporized from a liquid precursor, such as OMCTS for example, the process gas control subroutine 260 would be written to include steps for bubbling a carrier/delivery gas such as argon, helium, nitrogen, hydrogen, carbon dioxide, ethylene, or mixtures thereof, for example, through the liquid precursor in a bubbler assembly. The carrier gas typically has a flowrate between about 100 sccm to about 10,000 sccm, preferably 1,000 sccm.

For this type of process, the process gas control subroutine 260 regulates the flow of the delivery gas, the pressure in the bubbler, and the bubbler temperature in order to obtain the desired process gas flow rates. As discussed above, the desired process gas flow rates are transferred to the process gas control subroutine 260 as process parameters. Furthermore, the process gas control subroutine 260 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 270 has program code for controlling the pressure in the processing chamber 10 by regulating the size of the opening of the throttle valve in the exhaust pump 32. The size of the opening of the throttle valve is set to control the chamber pressure to the desired level in relation to the total process gas flow, size of the process chamber, and pumping set point pressure for the exhaust pump 32. When the pressure control subroutine 270 is invoked, the desired, or target pressure level is received as a parameter from the chamber manager subroutine 240. The pressure control subroutine 270 operates to measure the pressure in the processing chamber 10 by reading one or more conventional pressure manometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 270 can be written to open or close the throttle valve to a particular opening size to regulate the processing chamber 10 to the desired pressure.

The heater control subroutine 280 has program code for controlling the temperature of the heat modules or radiated heat that is used to heat the susceptor 12. The heater control subroutine 280 is also invoked by the chamber manager subroutine 240 and receives a target, or set point, temperature parameter. The heater control subroutine 280 measures the temperature by measuring voltage output of a thermocouple located in a susceptor 12, compares the measured temperature to the set point temperature, and increases or decreases current applied to the heat module to obtain the set point temperature. The temperature is obtained from the measured voltage by looking up the corresponding temperature in a stored conversion table, or by calculating the temperature using a fourth order polynomial. The heater control subroutine 280 gradually controls a ramp up/down of current applied to the heat module. The gradual ramp up/down increases the life and reliability of the heat module. Additionally, a built-in-fail-safe mode can be included to detect process safety compliance, and can shut down operation of the heat module if the processing chamber 10 is not properly set up.

The plasma control subroutine 290 includes program code for setting the VHF-RF bias voltage power level applied to the process electrodes in the processing chamber 10, and optionally, to set the level of the magnetic field generated in the reactor. Similar to the previously described chamber component subroutines, the plasma control subroutine 290 is invoked by the chamber manager subroutine 240.

The pretreatment and method for forming a pretreated layer of the present invention is not limited to any specific apparatus or to any specific plasma excitation method. The above CVD system description is mainly for illustrative purposes, and other CVD equipment such as electrode cyclotron resonance (ECR) plasma CVD devices, induction-coupled RF high density plasma CVD devices, or the like may be employed. Additionally, variations of the above described system such as variations in susceptor design, heater design, location of power connections and others are possible. For example, the substrate could be supported and heated by a resistively heated susceptor.

While the foregoing is directed to embodiments of the present invention, other and further embodiments of the invention may be devised without departing from the basic scope thereof, and the scope thereof is determined by the claims that follow.

What is claimed is:

1. A method of depositing a low dielectric constant film on a substrate, comprising:
    positioning the substrate in a deposition chamber;
    providing a gas mixture to the deposition chamber, wherein the gas mixture comprises one or more cyclic organosilicon compounds, one or more aliphatic compounds, and one or more oxidizing gases;
    reacting the gas mixture in the presence of an electric field to form the low dielectric constant film on the semiconductor substrate, wherein the electric field is generated using a very high frequency (VHF) power having a frequency in a range of 20 MHz to about 100 MHz.

2. The method of claim 1, wherein the low dielectric constant film is a carbon-doped silicon oxide film.

3. The method of claim 1, wherein the VHF power has a frequency of 68 MHz.

4. The method of claim 1, wherein the VHF power comprises at least a first VHF power having a frequency in a range of about 400 KHz to about 14 MHz and at least a second VHF power having a frequency in a range of about 20 MHz to about 100 MHz.

5. The method of claim 1, wherein the low dielectric constant film has a dielectric constant less than 2.5.

6. The method of claim 1, wherein the deposition chamber is a plasma enhanced chemical vapor deposition chamber.

7. The method of claim 1, wherein the one or more cyclic organosilicon compounds comprise at least one silicon-carbon bond.

8. The method of claim 1, wherein the one or more aliphatic compounds comprise a silicon-hydrogen bond or an unsaturated carbon-carbon bond.

9. The method of claim 1, wherein the one or more cyclic organosilicon compounds are selected from the group consisting of 3,5-trisilano-2,4,6-trimethylene, 1,3,5,7-tetramethylcyclotetrasiloxane (TMCTS), octamethylcyclotetrasiloxane (OMCTS), 1,3,5,7,9-pentamethylcyclopentasiloxane, 1,3,5,7-tetrasilano-2,6-dioxy-4,8-dimethylene, and hexamethylcyclotrisiloxane.

10. The method of claim 1, wherein the one or more aliphatic compounds comprise organosilicon compounds, hydrocarbon compounds, or a mixture thereof.

11. The method of claim 10, wherein the organosilicon compounds are selected from the group consisting of methylsilane, dimethylsilane, trimethylsilane, dimethyldimethoxysilane, ethylsilane, disilanomethane, bis(methylsilano)methane, 1,2-disilanoethane, 1,2-bis(methylsilano)ethane, 2,2-disilanopropane, 1,3-dimethyldisiloxane, 1,1,3,3-tetramethyldisiloxane (TMDSO), hexamethyldisiloxane (HMDS), 1,3-bis(silanomethylene)disiloxane, bis(1-methyldisiloxanyl)methane, 2,2-bis(1-methyldisiloxanyl)propane, diethylsilane, propylsilane, vinylmethylsilane, 1,1,2,2-tetramethyldisilane, hexamethyldisilane, 1,1,2,2,3,3-hexamethyltrisilane, 1,1,2,3,3-pentamethyltrisilane, dimethyldisilanoethane, dimethyldisilanopropane, tetramethyldisilanoethane, and tetramethyldisilanopropane.

12. The method of claim 10, wherein the hydrocarbon compounds are selected from the group consisting of ethylene, propylene, acetylene, butadiene, t-butylethylene, 1,1,3,3-tetramethylbutylbenzene, t-butylether, metylmethacrylate (MMA), and t-butylfurfurylether.

13. The method of claim 1, wherein the one or more cyclic organosilicon compounds is 3,5-trisilano-2,4,6-trimethylene, 1,3,5,7-tetramethylcyclotetrasiloxane (TMCTS), octamethylcyclotetrasiloxane (OMCTS), or a mixture thereof.

14. The method of claim 1, wherein the one or more aliphatic compounds comprises ethylene, methylsilane, dimethylsilane, trimethylsilane, or a mixture thereof.

15. The method of claim 1, wherein the one or more aliphatic compounds comprises ethylene and trimethylsilane.

16. A method of depositing a carbon-doped silicon oxide film on a substrate, comprising:

positioning the substrate in a deposition chamber; and reacting one or more organosilicon compounds in the presence of an electric field to form the carbon-doped silicon oxide film on the semiconductor substrate, wherein the electric field is generated using a very high frequency (VHF) power having a frequency in a range of about 20 MHz to about 100 MHz.

17. The method of claim 16, wherein the VHF power has a frequency of about 68 MHz.

18. The method of claim 16, wherein the VHF power comprises at least a first VHF power having a frequency in a range of about 400 KHz to about 14 MHz and at least a second VHF power having a frequency in a range of about 20 MHz to about 100 MHz.

19. The method of claim 16, wherein the deposition chamber is a plasma enhanced chemical vapor deposition chamber.

20. A method of depositing a low dielectric constant film on a substrate, comprising:

positioning the substrate in a deposition chamber;

providing a gas mixture to the deposition chamber, wherein the gas mixture comprises one or more cyclic organosilicon compounds, one or more aliphatic compounds, one or more meta-stable organic compounds and one or more oxidizing gases;

reacting the gas mixture in the presence of an electric field to transform the meta-stable organic compound to an unstable component within a network of the film, wherein the electric field is generated using a very high frequency power having a frequency in a range of about 20 MHz to about 100 MHz; and annealing the film to remove the unstable component from the film.

21. The method of claim 20, wherein annealing the film occurs at a temperature between about 100° C. to about 400° C. for about 2 seconds to about 10 minutes.

22. The method of claim 20, wherein the meta-stable compound is one of more compounds selected from the group consisting of t-butylethylene, 1,1,3,3-tetramethylbutylbenzene, t-butylether, metyl-methacrylate (MMA), and t-butylfurfurylether.

23. The method of claim 20, wherein the low dielectric constant film is a carbon doped silicon oxide (SiCOH) film.

24. The method of claim 20, wherein the very high frequency power further comprises a frequency in a range of about 400 KHz to about 14 MHz.

* * * * *

UNITED STATES PATENT AND TRADEMARK OFFICE
Certificate

Patent No. 6,797,643 B2

Patented: September 28, 2004

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Juan Carlos Rocha-Alvarez, Sunnyvale, CA (US); Maosheng Zhao, Santa Clara, CA (US); Ying Yu, Cupertino, CA (US); Shankar Venkataraman, Santa Clara, CA (US); Srinivas D. Nemani, Sunnyvale, CA (US); Li-Qun Xia, Sanat Clara, CA (US); Vinita Singh, Mountain View, CA (US); and Yi Zheng, Santa Clara, CA (US).

Signed and Sealed this Twentieth Day of June 2006.

MAICHAEL LEBENTRITT
*Supervisory Patent Examiner*
Art Unit 2812

UNITED STATES PATENT AND TRADEMARK OFFICE
Certificate

Patent No. 6,797,643 B2

Patented: September 28, 2004

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Juan Carlos Rocha-Alvarez, Sunnyvale, CA (US); Maosheng Zhao, Santa Clara, CA (US); Ying Yu, Cupertino, CA (US); Shankar Venkataraman, Santa Clara, CA (US); Srinivas D. Nemani, Sunnyvale, CA (US); Li-Qun Xia, Santa Clara, CA (US); Vinita Singh, Mountain View, CA (US); and Yi Zheng, Santa Clara, CA (US).

Signed and Sealed this Eighteenth Day of July 2006.

MICHAEL LEBENTRITT
*Supervisory Patent Examiner*
Art Unit 2812